United States Patent
Sung et al.

(10) Patent No.: US 7,510,976 B2
(45) Date of Patent: Mar. 31, 2009

(54) DIELECTRIC PLASMA ETCH PROCESS WITH IN-SITU AMORPHOUS CARBON MASK WITH IMPROVED CRITICAL DIMENSION AND ETCH SELECTIVITY

(75) Inventors: Shing-Li Sung, Campbell, CA (US); Wonseok Lee, Pleasanton, CA (US); Judy Wang, Cupertino, CA (US); Shawming Ma, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/434,951

(22) Filed: May 16, 2006

(65) Prior Publication Data

US 2007/0249171 A1    Oct. 25, 2007

Related U.S. Application Data

(60) Provisional application No. 60/793,935, filed on Apr. 21, 2006.

(51) Int. Cl.
*H01L 21/00*    (2006.01)
*B44C 1/22*    (2006.01)

(52) U.S. Cl. .................. 438/710; 438/706; 438/736; 216/41; 216/47; 216/67

(58) Field of Classification Search .............. 216/47, 216/67, 41; 438/706, 710, 736
See application file for complete search history.

(56) References Cited

U.S. PATENT DOCUMENTS

| | | | | |
|---|---|---|---|---|
| 6,051,505 | A  * | 4/2000  | Chu et al. | 438/710 |
| 6,468,599 | B1   | 10/2002 | Terada | 427/558 |
| 6,528,751 | B1   | 3/2003  | Hoffman et al. | 219/121.43 |
| 6,548,230 | B1   | 4/2003  | Liou et al. | 430/329 |
| 6,756,087 | B2   | 6/2004  | Terada | 427/558 |
| 7,153,780 | B2 * | 12/2006 | Hill et al. | 438/717 |
| 7,244,313 | B1   | 7/2007  | Zhou et al. | 134/1 |
| 2004/0005517 | A1 | 1/2004 | Gu et al. | 430/314 |
| 2005/0202683 | A1 * | 9/2005 | Wang et al. | 438/763 |
| 2006/0024945 | A1 * | 2/2006 | Kim et al. | 438/618 |
| 2006/0270239 | A1 * | 11/2006 | Triyoso et al. | 438/706 |

* cited by examiner

*Primary Examiner*—Shamim Ahmed
(74) *Attorney, Agent, or Firm*—Law Office of Robert M. Wallace

(57) ABSTRACT

A plasma etch process for successively different layers, including an anti-reflection coating (ARC), an amorphous carbon layer (ACL) and a dielectric layer, with successively different etch chemistries is performed in a single plasma reactor chamber. A first transition step is performed after etching the ARC by replacing the fluorine-containing process gas used in the ARC etch step with an inert species process gas. A flush step is performed after etching the ACL by replacing the hydrogen-containing process gas used in the ACL etch step with argon gas.

20 Claims, 5 Drawing Sheets

DIELECTRIC PLASMA ETCH PROCESS WITH IN-SITU AMORPHOUS CARBON MASK WITH IMPROVED CRITICAL DIMENSION AND ETCH SELECTIVITY

CROSS-REFERENCE TO RELATED APPLICATIONS

This application claims the benefit of U.S. Provisional Application No. 60/793,935, filed Apr. 21, 2006.

BACKGROUND OF THE INVENTION

The etching of hard dielectric thin films on an integrated circuit substrate, such as a boron silicate glass film or a phosphorous silicate glass film, is preferably done using a hard mask rather than a photoresist mask. Such a hard mask, which may be an amorphous carbon layer or ACL, is better able to withstand strong plasma etch chemistries required for efficient etching of a hard dielectric film. A typical device structure consists of a photoresist mask, an anti-reflection coating (ARC) underlying the photoresist mask, the ACL underlying the ARC, and the hard dielectric film underlying the ACL. Each of the layers under the photoresist mask is etched in sequence using different plasma chemistries. Prior efforts to perform each of these etch steps in a single reactor (to maximize productivity) have failed because such attempts resulted in loss of control over critical dimension (feature size) and the occurrence of significant particulate contamination. These problems have not been well-understood, and the industry has avoided them by performing at least some of the sequential etch steps referred to above (e.g., the etching of the ACL in a hydrogen-based plasma chemistry) in a separate dedicated reactor chamber. However, if all the foregoing etch steps could be performed in the same plasma reactor chamber, then productivity would be greatly increased.

We have discovered that one problem with using a hardmask such as an ACL arises from the fluorine-based chemistry that must be used to etch the ARC (typically a silicon oxy-nitride). This chemistry leaves a fluorine-containing residue within the chamber. If the different etch steps are performed in the same reactor chamber, we believe that this fluorine-containing residue subsequently reacts (during the next etch process) with hydrogen present in the hydrogen and nitrogen-based chemistry used to etch the ACL. We feel that the combination of the fluorine and hydrogen reacts with carbon in the ACL to create carbon-containing particulate contamination.

Another problem we have discovered is that the hydrogen present in the nitrogen+hydrogen process gases employed to etch the ACL leaves a hydrogen or hydrogen containing residue in the chamber (on chamber surfaces and possibly on the wafer itself) that remains after conclusion of this etch step. We believe that, during the subsequent etching of the hard dielectric layer, hydrogen from the residue combines with fluorine in the fluorine-containing plasma chemistry used in the hard dielectric layer etch step. This reduces the amount of fluorine available to participate in the etch reaction, slowing down the etch rate and reducing control over the critical dimension (feature size) in the hard dielectric layer. Typically, the critical dimension is reduced below the desired magnitude.

Therefore, there is a need for a process for etching a hard dielectric layer (such as boron- or phosphorus-silicate glass) using a hard mask (such as amorphous carbon) in which the steps for etching the different layers with different plasma chemistries is carried out in the same reactor chamber without loss of control over critical dimension or feature size and without producing particulate contamination.

SUMMARY OF THE INVENTION

A plasma-enhanced process is performed in a single plasma reactor chamber for etching a thin film layer on a workpiece, using a hard mask layer including an amorphous carbon layer (ACL) overlying the thin film layer and an anti-reflection coating (ARC) overlying the ACL. The process includes etching a pattern in the ARC in accordance with a photoresist mask overlying the ARC, using a plasma produced from a fluorine-containing process gas, and then removing fluorine-containing residue from the reactor chamber and/or workpiece by performing a first transition step by replacing the fluorine-containing process gas with an inert species process gas and maintaining a plasma in the reactor chamber. A pattern is then etched in the ACL using the ARC as an etch mask by replacing the argon process gas with a process gas containing hydrogen while maintaining a plasma in the chamber. Thereafter, hydrogen-containing residue is removed from the reactor and/or from the chamber by performing a flush step by replacing the hydrogen-containing process gas with argon gas and maintaining a plasma in the chamber. The process continues with etching a pattern in the thin film layer using the ACL as a hard mask by replacing the argon gas in the chamber with a species capable of etching the thin film layer.

DETAILED DESCRIPTION OF THE INVENTION

Figure 1:
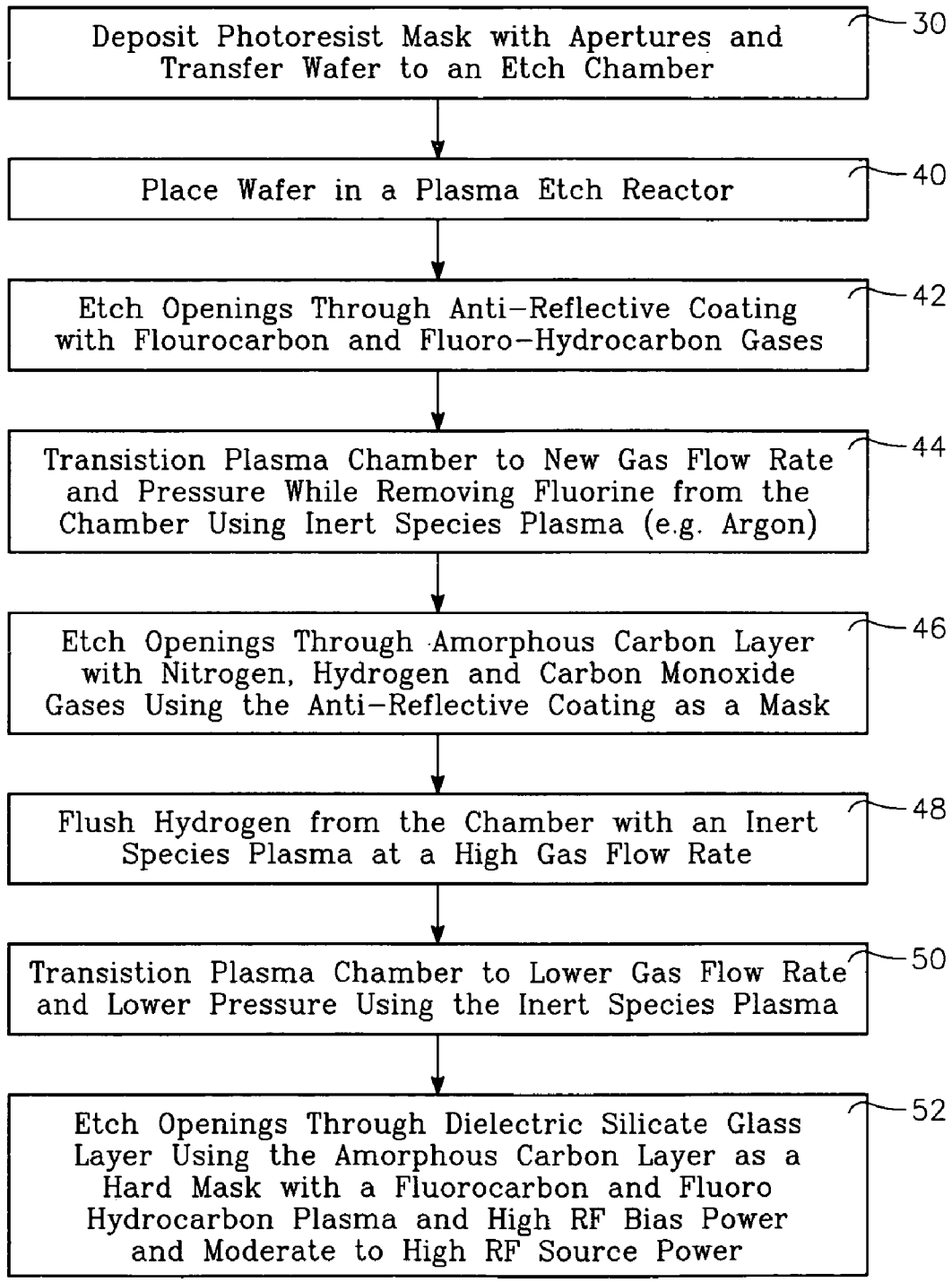
FIG. 1 is a block flow diagram of a process embodying the invention.

The present invention concerns integrated circuit fabrication and specifically a plasma-enhanced etch process (illustrated in FIG. 1) that is suitable for etching a hard dielectric thin film on a semiconductor wafer, such as boron-silicate glass (BSG) or phosphorus-silicate glass (PSG), using a hard mask layer such as an amorphous carbon layer (ACL). Typically, the amorphous carbon mask is etched in accordance with a desired mask pattern prior to etching the underlying hard dielectric thin film. For this purpose, an anti-reflection coating (ARC) is placed on the hard mask layer and a photoresist mask is placed on the ARC. The thin film structure at this point is depicted in FIG. 2A, and includes a substrate or base layer 5 of a semiconductor wafer on which is formed a hard dielectric thin film 10 such as BSG or PSG. A hard mask 15 such as an amorphous carbon layer (ACL) overlies the hard dielectric thin film 10. An anti-reflection coating (ARC) 20 of a material such as silicon oxy-nitride overlies the ACL 15. Photoresist 25 is deposited on the ARC 20. In the step of block 30 of FIG. 1, the photoresist 25 is formed into a mask by photolithographically forming apertures 32 through the resist 25 in accordance with a desired pattern. The wafer is then placed in a plasma etch reactor chamber (block 40 of FIG. 1). The resist 25 is then employed as a mask in an etch step (block 45 of FIG. 1) that extends the aperture 32 through the ARC 20. The etch step of block 42 is carried out by introducing into the reactor chamber a process gas that (preferably) contains both a fluorocarbon gas and a fluoro-hydrocarbon gas and maintaining a chamber pressure between about 50 mT and 150 mT. One example of such a process gas is $CF_4$ and $CH_2F_2$. Plasma source power and plasma bias power are coupled into the chamber. These conditions are maintained until the aperture 32 extends through the ARC 20 as shown in FIG. 2C.

The next etch step to be performed in the reactor chamber extends the aperture 32 through the ACL 15 using the ARC 20 as the etch mask. However, before this next etch step is performed, a transition process step (block 44 of FIG. 1) is performed first. One purpose of the transition step of block 44 is to stabilize the plasma in the chamber while the fluorine-based process gas is removed from the reactor chamber and the chamber pressure is changed and a new process gas flow rate is established. This is accomplished using an argon plasma chemistry, as depicted in FIG. 2D. A more important purpose of the transition step of block 44 is to remove the fluorine-containing residue remaining the reactor chamber (e.g., on chamber interior surfaces or even on the wafer itself). The argon plasma chemistry is adequate to remove all the fluorine-containing residue. For this purpose, a very high argon gas flow rate (e.g., 800 sccm) is employed at a moderate chamber pressure (e.g., 100 mT). This process step preferably employs only modest plasma RF source power (100 Watts) and modest plasma RF bias power (e.g., 100 Watts). The modest amounts of source and bias power minimize (or prevent) undue ion bombardment effects on the wafer or thin film structure during the transition process step of block 44 of FIG. 1.

Figure 2A:
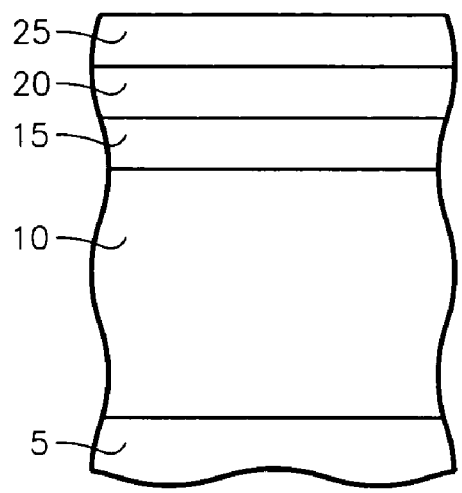
FIGS. 2A, 2B, 2C, 2D, 2E, 2F and 2G depict in chronological order the changes in a thin film structure during successive steps of the process of FIG. 1.
Figure 2B:
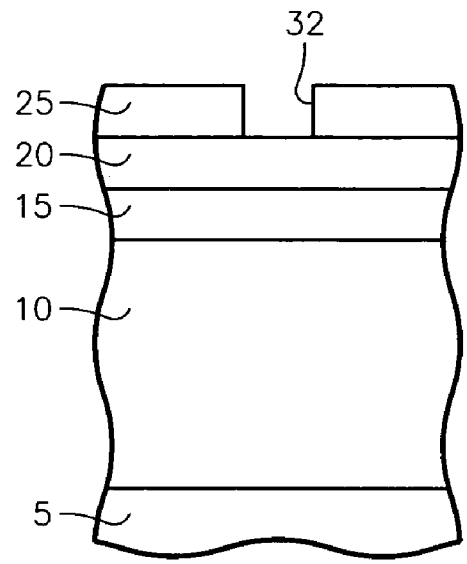
Figure 2C:
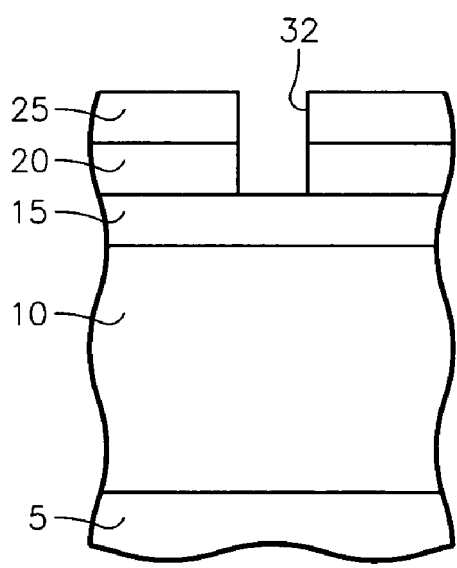
Figure 2D:
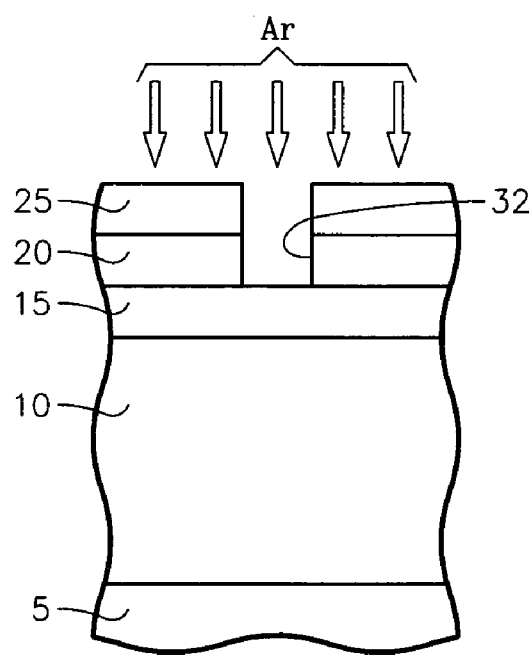
Figure 2E:
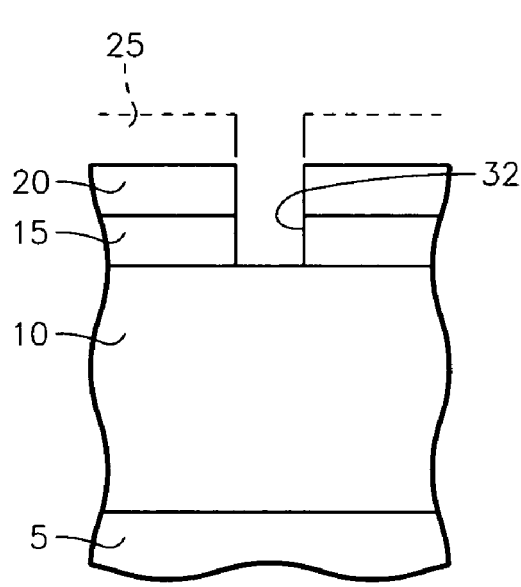
Figure 2F:
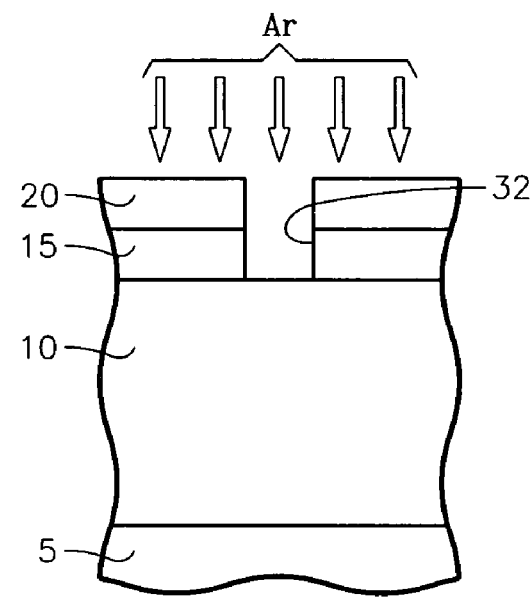

Upon removal of all the fluorine-containing residue, an etch step (block 46 of FIG. 1) is performed that extends the opening 32 through the ACL 15, as depicted in FIG. 2E. This step is performed by flowing into the reactor chamber a process gas containing (preferably) hydrogen gas, nitrogen gas and carbon monoxide gas. In addition, the process gas can include at least one of the following gases: oxygen, methane ($CH_4$), $C_2H_4$, sulfur dioxide ($SO_2$), carbon dioxide ($CO_2$). These gases react (or are precursors for species that react) with the photoresist layer 25 and remove it, as indicated in FIG. 2E. The flow of argon is halted so that the argon gas is removed from the reactor chamber. This step leaves a hydrogen-containing residue in the reactor chamber (e.g., on chamber interior surfaces and possibly on the wafer itself). A flush step (block 48 of FIG. 1) is performed to remove the hydrogen-containing residue. The flush step of block 48 employs an argon plasma with modest RF plasma source power (e.g., 100 Watts) and modest RF plasma bias power (e.g., 100 Watts) to avoid undue ion bombardment effects on the wafer. However, to ensure efficient removal of the hydrogen residue, this step employs a very high argon gas flow rate (e.g., 1000 sccm) at a modest chamber pressure (e.g., about 100 mT). The flush step of block 48 is depicted in FIG. 2F.

Figure 2G:
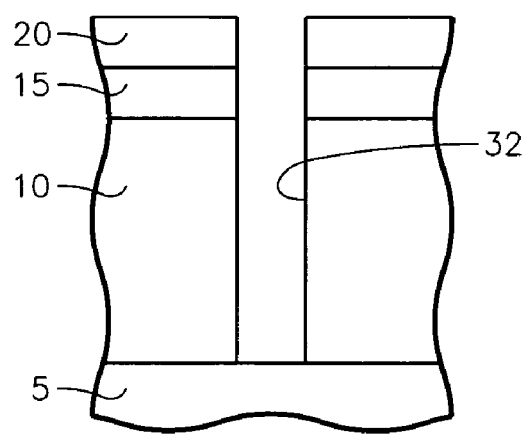

The next etch step to be performed etches through the hard dielectric thin film using the ACL as a hard mask. However, before this etch step is performed, a transition step (block 50 of FIG. 1) is performed which stabilizes the plasma while the plasma process conditions are changed to conform with the requirements of the etch step to be performed. This transition step (block 50) is performed using the argon plasma, but the gas (argon) flow rate and the chamber pressure are reduced to match the etch process gas flow rate (e.g., 274 sccm) and chamber pressure (e.g., 8-20 mT) that will be used during the etch step that follows. Also, the RF plasma source power is increased for the same purpose (e.g., from 100 Watts to 200 Watts). Once the plasma has stabilized, the hard dielectric thin film (10 of FIG. 2A) is etched (block 52 of FIG. 1) to extend the opening 32 through the dielectric thin film 10, as depicted in FIG. 2G. Preferably the hard dielectric etch step of block 52 is performed with a process gas that includes $C_4F_6$, $O_2$, Ar, CO and $CH_2F_2$ gases at a total gas flow rate of about 274 sccm at a chamber pressure of about 8 mT. RF plasma source power of 200 to 600 Watts is applied. RF bias power having components at an LF (2 MHz) frequency and an HF (13.56 MHz) frequency is applied to the wafer at a total power level of about 5000 Watts.

Figure 3:
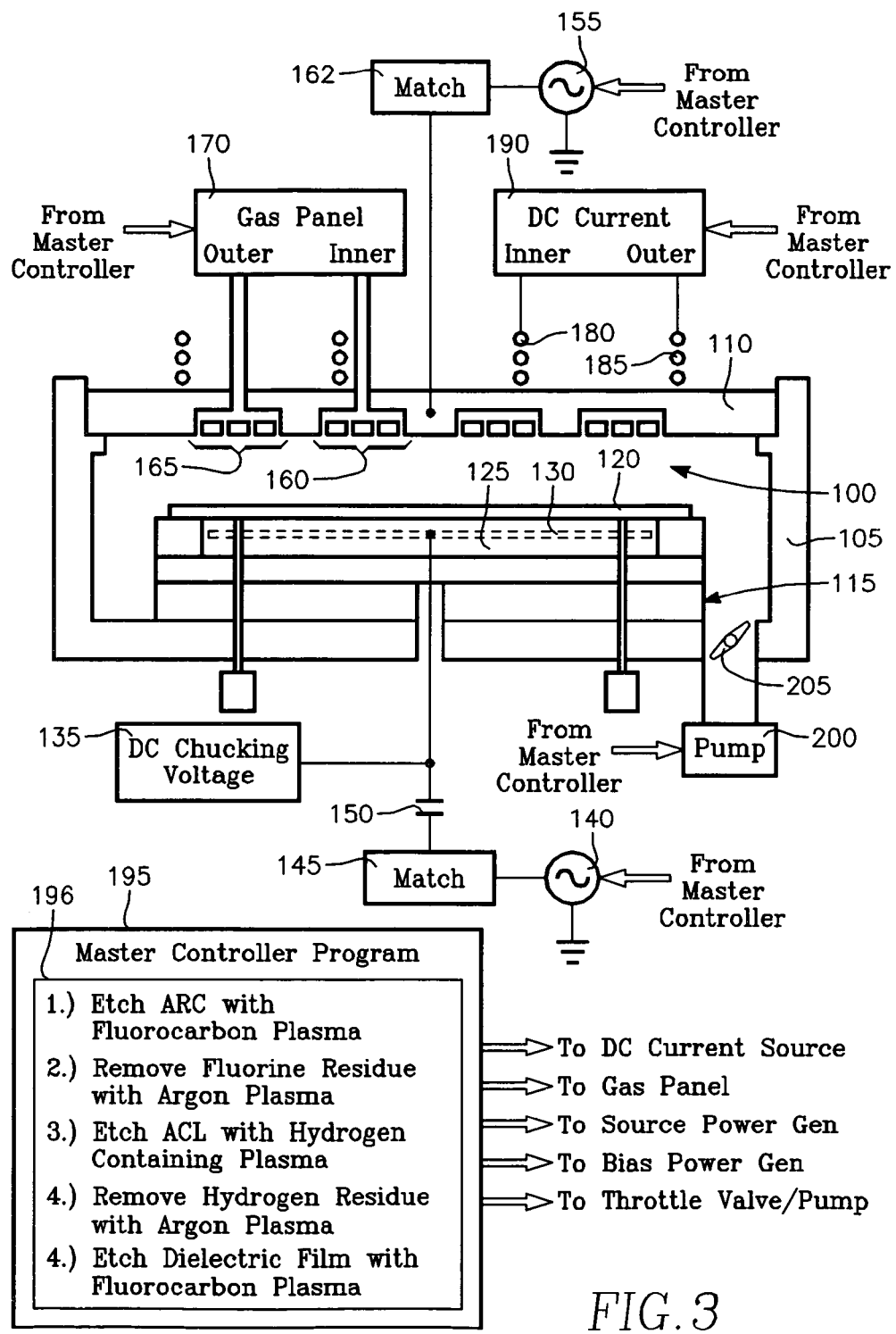
FIG. 3 depicts a plasma reactor of the type suited for carrying out the process of FIG. 1 and having a controller programmed to execute the process of FIG. 1.

FIG. 3 depicts a plasma reactor for carrying out the process of FIG. 1. The reactor of FIG. 3 has a vacuum chamber 100 defined by a cylindrical side wall 105 and a disk-shaped ceiling electrode 110. An electrostatic chuck 115 supporting the wafer 120 includes an insulator layer 125 having an internal electrode 130 coupled to a D.C. chucking voltage supply 135. An RF plasma bias power generator 140 is coupled to the electrode 130 through an impedance match element 145 and an isolation capacitor 150. A VHF (e.g., 162 MHz) RF source power generator 155 is coupled through an impedance match element 162 to the ceiling electrode 110. The impedance match element may be a coaxial tuning stub that is resonant near the frequency of the VHF generator 155, the electrode 110 having a reactance that forms a resonance with plasma in the chamber 100 near the frequency of the VHF generator 155, as disclosed in U.S. Pat. No. 6,528,751 issued Mar. 4, 2003 entitled PLASMA REACTOR WITH OVERHEAD RF ELECTRODE TUNED TO THE PLASMA by Daniel Hoffman et al., the disclosure of which is incorporated herein by reference. The ceiling electrode 110 is also a gas distribution showerhead. Process gases flow into the chamber 100 through an inner zone 160 of gas distribution orifices in the ceiling electrode 110 and an outer zone 165 of gas distribution orifices. A gas panel 170 provides selected process gases and apportions the gas flow between the inner and outer zones 160, 165. Inner and outer electromagnets 180, 185 control plasma ion density distribution within the chamber 100 in accordance with D.C. currents applied to them from a D.C. current supply 190. A vacuum pump 200 modulated by a throttle valve 205 establishes a desired vacuum chamber pressure in the chamber 100. A master controller 195 is programmed with a set of instructions 196 to perform a process sequence of the type depicted in FIG. 1, and for that purpose controls the operation of the gas panel 170, the D.C. magnet current supply 190, the VHF source power generator 155, the RF bias power generator 140 and the throttle valve 205. In this case, the set 196 of instructions with which the master controller 195 is programmed are as follows: (1) control the gas panel 170 to flow $CF_4$ and $CH_2F_2$ into the chamber 100 and control the source and bias power generators 155, 140 to apply RF plasma source power and RF plasma bias power (block 42 of FIG. 1); (2) control the gas panel 170 to flow argon into the chamber 100 while maintaining a plasma and stop the flow of the fluorine-containing gases (block 44 of FIG. 1); (3) control the gas panel 170 to flow nitrogen, hydrogen and carbon monoxide into the chamber 100 while maintaining the plasma and stop the flow of argon (block 46 of FIG. 1); (4) control the gas panel 170 to flow argon at a high flow rate while maintaining a plasma and stop the flow of the N2, H2 and CO gases (block 48 of FIG. 1); (5) reduce the flow rate of argon and increase the plasma source power (block 50 of FIG. 1); and flow C4F6, O2, Ar, CO and CH2F2 while increasing the plasma source power and plasma bias power to high levels (block 52 of FIG. 1).

The step of block 42 is preferably performed at a chamber pressure between 50 and 150 mT.

The step of block 44 is preferably performed with an argon gas flow rate of about 800 sccm at a chamber pressure between about 50 and 150 mT, with the throttle valve 205 100% open, 100 Watts of RF plasma source power from the generator 155, 100 Watts of RF plasma bias power from the generator 140, a ratio between the gas flow rates of the inner and outer gas orifice zones of 2:1 established by the gas panel 170, 4 amperes D.C. driving the inner coil 180 and 4 amperes D.C. driving the outer coil 185, this step being performed for 10 seconds.

The step of block 46 is preferably performed at a chamber pressure of about 100 mT.

The step of block 48 is performed with an argon gas flow rate of 1000 sccm established with the gas panel 170 at a chamber pressure of about 100 mT established by the throttle valve 205, with 100 Watts of RF plasma source power from the generator 155, 100 Watts of RF plasma bias power from the generator 140, a ratio of 2.5 between the gas flow rates to the outer and inner orifice zones 165, 160, and 6 amperes D.C. applied to the inner electromagnetic coil 180 only, for a time of about 15 seconds.

The step of block 50 is performed with a reduced argon gas flow rate of 274 sccm at a pressure of 8 mT, with 200 Watts of RF plasma source power, 100 Watts of RF plasma bias power and the same inner and outer zone gas flow ratio and electromagnetic coil current conditions as the previous step, for a time of about 10 seconds.

The etch step of block 52 is preferably performed with a process gas of C4F6, O2, Ar, CO, and CH2F2 at a flow rate of 274 sccm at a chamber pressure of 8 mT, 5000 Watts of RF plasma bias power with frequency components at 2 MHz and 13.56 MHz, and RF plasma source power between 200 and 600 Watts at a VHF frequency of 162 MHz.

Results:

We performed three etch processes on three wafers having the same thin film structure illustrated in FIG. 2A. A first etch process (performed on a first wafer) was the prior art ex-situ process in which the different etch steps are performed in different plasma etch reactor chambers, or at least the fluorine chemistry etch steps (blocks 42 and 52 of FIG. 1) were performed in a chamber different from the chamber in which the hydrogen chemistry etch step (block 46 of FIG. 1) was performed. A second etch process (performed on a second wafer) was an in-situ process in which all the etch steps were performed in succession in the same plasma etch reactor chamber. The third etch process performed (on the third wafer) was the process of the present invention depicted in FIG. 1, which is an in-situ+flush process (i.e., with added flush and transitions steps between etch steps). Comparing the etch performance among the three wafers, the results were surprising.

Figure 4:
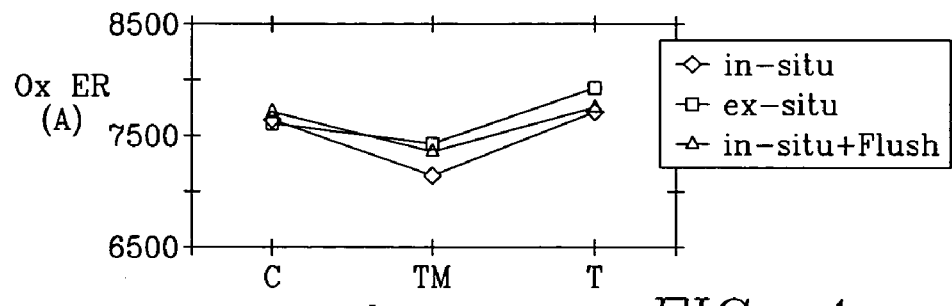
FIG. 4 is a graph depicting radial distributions of the oxide etch rate (in the dielectric thin film layer 10 of FIG. 2) obtained in the ex-situ process (square symbols), the in-situ process (diamond symbols) and the in-situ+flush process of the present invention (triangle symbols).

FIG. 4 is a graph depicting radial distributions of the oxide etch rate (in the dielectric thin film layer 10 of FIG. 2) obtained in the ex-situ process (square symbols), the in-situ process (diamond symbols) and the in-situ+flush process of the present invention (triangle symbols). FIG. 4 shows that the in-situ process has inferior oxide etch rate compared with the ex-situ process, attributable to the presence of hydrogen that reduces fluorine species available for etch. Remarkably, the process of the invention nearly matches that of the ex-situ process except near the wafer periphery, this latter exception obtaining due to the improved uniformity of the process of the present invention and relative non-uniformity of the prior art ex-situ process. Thus, the present invention represents an improvement in oxide etch rate over the in-situ process and in uniformity of the radial distribution of the oxide etch rate over the ex-situ process.

Figure 5:
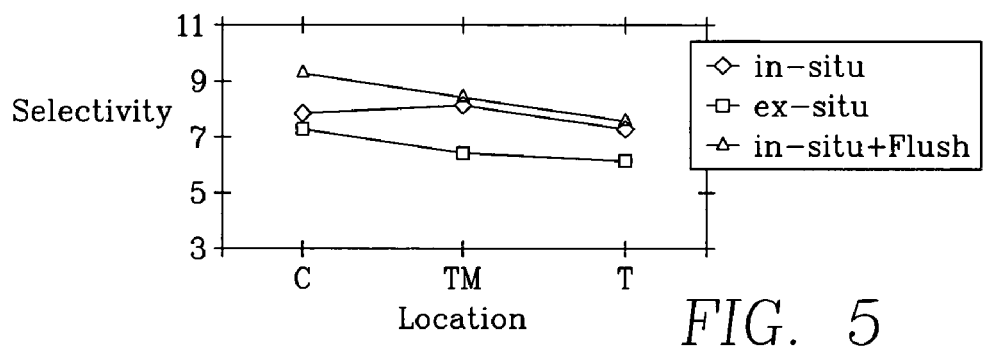
FIG. 5 is a graph depicting radial distributions of the oxide etch selectivity (in the dielectric thin film layer 10 of FIG. 2) using the same symbology used in FIG. 4.

FIG. 5 is a graph depicting radial distributions of the oxide etch selectivity (in the dielectric thin film layer 10 of FIG. 2) using the same symbology used in FIG. 4. FIG. 5 shows that the in-situ process has superior etch selectivity relative to the ex-situ process, which is to be expected because the presence of hydrogen reduces the fluorine availability, raising the proportion of carbon-to-fluorine in the polymer deposited on the mask during etch, thereby enhancing selectivity. Thus, it would be expected that in the present invention, which removes hydrogen to increase available fluorine, the etch selectivity would fall. However, FIG. 5 indicates that quite the opposite occurs: etch selectivity in the process of the present invention is superior to the ex-situ process AND to the in-situ process. Therefore, the surprising result is that there is no trade-off in the present invention between etch selectivity and etch rate.

Figure 6:
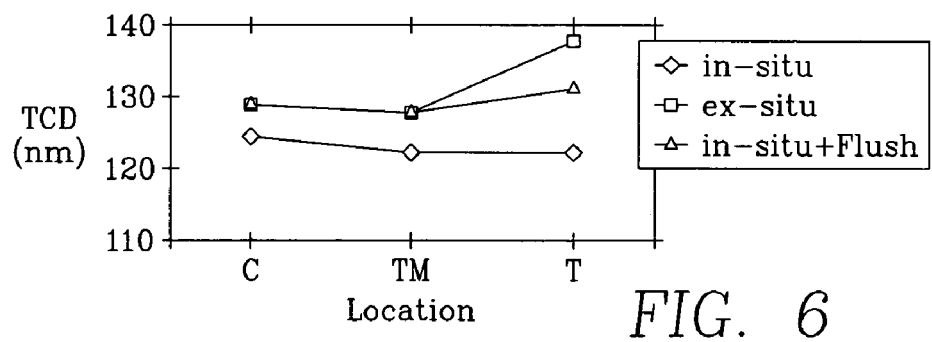
FIG. 6 is a graph depicting the radial distributions of the top critical dimension obtained in the three processes, using the same symbology employed in the preceding graphs.

FIG. 6 is a graph depicting the radial distributions of the top critical dimension obtained in the three processes, using the same symbology employed in the preceding graphs. FIG. 6 shows that the in-situ process yields the worst results while the present invention yields results as good as or nearly as good as the ex-situ process except near the wafer periphery. This last exception is attributable to the superior uniformity of results obtained in the process of the present invention and the relative non-uniformity of results obtained in the ex-situ process.

Figure 7:
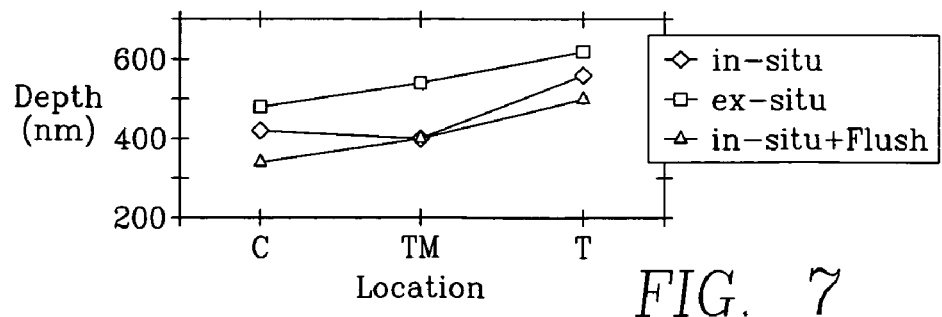
FIG. 7 is a graph depicting radial distributions of oxide etch depth obtained in the same three processes, using the symbology employed in the preceding graphs.

FIG. 7 is a graph depicting radial distributions of oxide etch depth obtained in the same three processes, using the symbology employed in the preceding graphs. FIG. 7 shows that the present invention, while not yielding etch depths less than either of the other two processes, provides the most radially uniform distribution of oxide etch depth.

While the invention has been described in detail by specific reference to preferred embodiments, it is understood that variations and modifications thereof may be made without departing from the true spirit and scope of the invention.

What is claimed is:

1. A plasma-enhanced process performed in a single plasma reactor chamber for etching a thin film layer on a workpiece, using a hard mask layer comprising amorphous carbon layer (ACL) overlying the thin film layer and an anti-reflection coating (ARC) overlying the ACL, comprising:

placing said workpiece in the plasma reactor chamber and etching a pattern in said ARC in accordance with a photoresist mask overlying the ARC, using a plasma produced from a fluorine-containing process gas;

performing a first transition step by replacing said fluorine-containing process gas with an inert species process gas and maintaining a plasma in said reactor chamber;

etching a pattern in said ACL using said ARC as an etch mask by replacing said inert species process gas with a process gas containing hydrogen and maintaining a plasma in said chamber;

performing a flush step by replacing said hydrogen-containing process gas with inert species process gas and maintaining a plasma in said chamber; and etching a pattern in said thin film layer using said ACL as a hard mask by replacing said inert species process gas in said chamber with a species capable of etching said thin film layer.

2. The process of claim 1 wherein said first transition step and said flush step are both carried out with a high gas flow rate of inert species process gas into said chamber on the order of 800 sccm or greater.

3. The process of claim 2 further comprising performing a second transition step immediately after said flush step and before the step of etching a pattern in said thin film layer, said second transition step being carried out by reducing the gas flow rate of inert species process gas into said chamber to a low level on the order of 200 to 300 sccm.

4. The process of claim 3 wherein said first transition step, said flush step and said second transition step are carried out by applying a low level of RF plasma source power to plasma in said chamber on the order of 100 to 200 Watts and applying a low level of RF plasma bias power to plasma in said chamber on the order of about 100 Watts.

5. The process of claim 4 wherein the step of etching said dielectric thin film layer is carried out by applying a high source power level on the order of about 200-600 Watts and a high bias power level on the order of about 5000 Watts.

6. The process of claim 1 wherein said RF plasma source power is of a VHF frequency and said bias power comprises a low frequency component and a high frequency component.

7. The process of claim 6 wherein said VHF frequency is about 162 MHz, said low frequency component is about 2 MHz and said high frequency component is about 13.56 MHz.

8. The process of claim 1 wherein the step of maintaining a plasma comprises coupling RF bias power to said workpiece, said RF bias power comprising a low frequency component and a high frequency component, and coupling RF plasma source power of a VHF frequency to an overhead electrode of said reactor.

9. The process of claim 1 wherein said hydrogen-containing gas comprises hydrogen and nitrogen and carbon monoxide gases.

10. The process of claim 9 wherein said hydrogen containing gas further comprises at least one of the following gases: oxygen, methane (CH4), C2H4, sulfur dioxide (SO2), carbon dioxide (CO2).

11. The process of claim 1 wherein said first transition step is carried out for a sufficient amount of time to remove fluorine containing residues from said reactor chamber, and said flush step is carried out for a sufficient amount of time to remove hydrogen-containing residues from said chamber.

12. A plasma-enhanced process performed in a single plasma reactor chamber for etching a thin film layer on a workpiece, using a hard mask layer comprising amorphous carbon layer (ACL) overlying the thin film layer and an anti-reflection coating (ARC) overlying the ACL, comprising:

placing said workpiece in the plasma reactor chamber and etching a pattern in said ARC in accordance with a photoresist mask overlying the ARC, using a plasma produced from a fluorine-containing process gas;

removing fluorine-containing residue from said reactor chamber and/or workpiece;

etching a pattern in said ACL using said ARC as an etch mask with a process gas containing hydrogen while maintaining a plasma in said chamber;

removing hydrogen-containing residue from said reactor and/or from said workpiece; and etching a pattern in said thin film layer using said ACL as a hard mask with process gas in said chamber comprising a precursor for a species capable of etching said thin film layer.

13. The process of claim 12 wherein:

the step of removing fluorine-containing residue comprises performing a first transition step by replacing said fluorine-containing process gas with an inert species process gas while maintaining a plasma in said reactor chamber; and the step of removing hydrogen-containing residue comprises performing a flush step by replacing said process gas containing hydrogen with an inert gas while maintaining a plasma in said chamber.

14. The process of claim 13 wherein said first transition step is carried out for a sufficient amount of time to remove fluorine containing residues from said reactor chamber, and said flush step is carried out for a sufficient amount of time to remove hydrogen-containing residues from said chamber.

15. The process of claim 14 wherein said first transition step and said flush step are both carried out with a high gas flow rate of inert gas into said chamber on the order of 800 sccm or greater.

16. The process of claim 15 further comprising performing a second transition step immediately after said flush step and before the step of etching a pattern in said thin film layer, said second transition step being carried out by reducing the gas flow rate of inert gas into said chamber to a low level on the order of 200 to 300 sccm.

17. The process of claim 16 wherein said first transition step, said flush step and said second transition step are carried out by applying a low level of RF plasma source power to plasma in said chamber on the order of 100 to 200 Watts and applying a low level of RF plasma bias power to plasma in said chamber on the order of about 100 Watts.

18. The process of claim 17 wherein the step of etching said dielectric thin film layer is carried out by applying a high source power level on the order of about 200-600 Watts and a high bias power level on the order of about 5000 Watts.

19. A plasma-enhanced process performed in a single plasma reactor chamber for etching a thin film layer on a workpiece, using a hard mask layer comprising amorphous carbon layer (ACL) overlying the thin film layer and an anti-reflection coating (ARC) overlying the AOL, comprising:

continuously supporting the workpiece in the plasma reactor chamber while maintaining a plasma in the chamber during the following:

etching successive ones of said ARC, ACL and thin film layer in successive etch steps employing successive process gases comprising a fluorine-containing gas during etching of said ARC, a hydrogen-containing gas during etching of said ACL and a gas comprising a precursor of an etchant of said thin film layer during etching of said thin film;

performing a first transitioning after the etching of said ARC and before the etching of said ACL, said transitioning comprising replacing the fluorine-containing gas in said chamber with an inert gas for a sufficient time to remove fluorine-containing residues from said chamber; and performing a flushing after the etching of said ACL and before the etching of said thin film layer, said flushing comprising replacing the hydrogen-containing gas in said chamber with an inert gas for a sufficient time to remove hydrogen-containing residues from said chamber.

20. The process of claim 19 wherein said first transitioning and said flushing are carried out with an inert gas flow rate into the chamber on the order of 800 sccm or greater during said etching, said process further comprising:

performing a second transitioning after said flush step and before the etching of said thin film layer, said second transitioning comprising reducing the gas flow rate of said inert gas into said chamber to 200 to 300 sccm.

* * * * *